(12) United States Patent
Yun et al.

(10) Patent No.: US 6,349,455 B1
(45) Date of Patent: Feb. 26, 2002

(54) METHOD FOR FORMING PIEZOELECTRIC/ ELECTROSTRICTIVE FILM ELEMENT AT LOW TEMPERATURE USING ELECTROPHORETRIC DEPOSITION

(75) Inventors: Sang Kyeong Yun; Dong Hoon Kim, both of Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/417,415

(22) Filed: Oct. 13, 1999

Related U.S. Application Data
(60) Provisional application No. 60/104,235, filed on Oct. 14, 1998.

(30) Foreign Application Priority Data

Oct. 14, 1998 (KR) .............................................. 98-42911
Jul. 6, 1999 (KR) .............................................. 99-27080

(51) Int. Cl.[7] ................................................ H01L 41/00
(52) U.S. Cl. ........................................ 29/25.35; 427/1
(58) Field of Search .............................. 29/25.35; 427/1

(56) References Cited

U.S. PATENT DOCUMENTS 5,631,040 A * 5/1997 Takuchi et al. ......... 29/25.35 X
5,825,121 A * 10/1998 Shimada ................. 29/25.35 X

* cited by examiner

Primary Examiner—Carl E. Hall
(74) Attorney, Agent, or Firm—Darby & Darby

(57) ABSTRACT

A method for forming piezoelectric/electrostrictive film element at low temperature using electrophoretic deposition includes the steps of: dissolving or dispersing the raw material of constituent ceramic elements in a solvent or a dispersion medium; adding citric acid into the solution or the dispersed mixture; obtaining ultrafine ceramic oxide powder of particle size less than 1 $\mu$m with uniform particle diameter size distribution by forming ceramic oxide by a nonexplosive oxidative-reductive combustion reaction by thermally treating the mixed solution at 100–500° C.; preparing a suspension by dispersing the ultrafine ceramic oxide powder in an organic dispersant; preparing ceramic sol solution by dissolving constituent ceramic elements of the same or similar constituent as the ultrafine ceramic oxide powder in water or an organic solvent; mixing the suspension with the ceramic sol solution; forming a piezoelectric/electrostrictive film element by submerging a substrate into this mixture and then by performing electrophoretic deposition; and thermally treating the piezoelectric/electrostrictive film element at 100–600° C.

22 Claims, 3 Drawing Sheets

METHOD FOR FORMING PIEZOELECTRIC/ELECTROSTRICTIVE FILM ELEMENT AT LOW TEMPERATURE USING ELECTROPHORETRIC DEPOSITION

This application claims benefit of U.S. Provisional No. 60/104,235 filed Oct. 14, 1998.

BACKGROUND OF THE INVENTION

1. Field of the Invention

The present invention relates to a method for forming piezoelectric/electrostrictive film element using an ultrafine ceramic oxide powder and electrophoretic deposition. In particular, the present invention relates to a method for forming a piezoelectric/electrostrictive film element at low temperature by way of electrophoretic deposition method using an ultrafine ceramic oxide powder having excellent reactivity and produced by a single process at low temperature.

2. Description of the Prior Art

Unit particle micronization and uniformity of particle diameter distribution are emphasized in ceramic oxide powder which is a raw material of various devices using the ceramics such as an ink jet head, memory chip, and piezoelectric substance. This is because, in case of finer particles, the activation energy can be lowered by surface treatment and the reactivity and applicability can be improved by particle electrification.

So far the method has been used where a ceramic sol with controlled viscosity or a ceramic oxide powder regenerated by a suitable solvent is fixed at the substrate in order to form a piezxoelectric/electrostrictive film element in a manufacturing method of various film devices using the ceramics.

Considering the ultimately obtained film quality, methods mainly used for the ceramic sol solution are dip coating, spin coating, electrochemical oxidation/reduction etc. while methods used for the ceramic oxide powder are various printing, molding, electrophoretic deposition (ERD) etc.

Among these methods, EPD is a method to mold an elaborate film, making use of the polarization of each component by electric polarity and the stacking property of solid particles.

In the EPD process using a ceramic oxide powder, shown in block diagram form in FIG. 2, ceramic particles of average diameter not less than 1 $\mu$m made by a solid phase process are dispersed in an adequate dispersion medium of water or organic dispersed in adequate dispersion medium of water or organic dispersant. Then, they are mixed with a pH-controlling medium to make a sol solution controlled in surface electric charge, which the colloidal suspension is used for ceramic to move to a cathode or anode to form a film on a substrate. This film is vapor deposited by thermal treatment above 1000° C., eventually to, form the film.

EPD like this has an advantage to make a high quality film unrestricted in area or thickness, using a simple equipment.

But a separate operation is needed to disperse powder using a dispersant, in order to secure dispersibility because a large particle diameter powder is used. Also, there is inevitability a problem of high temperature thermal treatment to get material property peculiar to the ceramic, because the formed film property is similar to the bulk.

SUMMARY OF THE INVENTION

The present invention, to solve the problems, has a purpose of providing a method to form a piezoelectric/electrostrictive film element through electrophoretic deposition and thermal treatment at low temperature using ultrafine ceramic oxide powder, which is excellent in reactivity and has very fine particle size, as it has been made by a single process at low temperature by a combustion method using citric acid as a combustion aid.

The present invention to achieve the purpose, provides a method for forming a piezoelectric/electrostrictive film element at low temperature using electrophoretic deposition, the method comprising the steps of: preparing a solution or a dispersed mixture containing constituent ceramic elements by dissolving or dispersing the raw material of constituent ceramic elements in a solvent or a dispersion medium; preparing a mixed solution by adding citric acid into the solution or the dispersed mixture in which the constituent ceramic elements are dissolved or dispersed; getting ultrafine ceramic oxide powder of particle size less than 1 $\mu$m with uniform particle diameter size distribution, by forming ceramic oxide without scattering over, by a nonexplosive oxidative-reductive combustion reaction by thermally treating the mixed solution at 100–500° C.; preparing a suspension by dispersing the ultrafine ceramic oxide powder in an organic dispersant; preparing a ceramic sol solution by dissolving constituent ceramic elements of the same or similar constituent as the ultrafine ceramic oxide powder in water or an organic solvent; dispersing by mixing with the ceramic sol solution the suspension in which the ultrafine ceramic oxide powder is dispersed; forming a piezoelectric/electrostrictive film element by submerging a substrate into the suspension in which the ultrafine ceramic oxide powder and the ceramic sol solution are mixed and then performing electrophoretic deposition; and thermally treating the piezoelectric/electrostrictive film element at 100–600° C., so that the solvent is removed by the thermal treatment and bonding among the ultrafine ceramic oxide powder particles is induced, while the ceramic sol acts as a reaction medium on the surfaces of the ceramic oxide particles.

Also the present invention features a piezoelectric/electrostrictive film element produced by a method comprising the steps of: preparing a solution or a dispersed mixture containing constituent ceramic elements by dissolving or dispersing the raw material of constituent ceramic elements in a solvent or dispersion medium; preparing a mixed solution by adding citric acid into the solution or the dispersed mixture in which the constituent ceramic elements are dissolved or dispersed; getting ultrafine ceramic oxide powder of particle size less than 1 $\mu$m with uniform particle diameter size distribution by forming ceramic oxide without scattering over, by a nonexplosive oxidative-reductive combustion reaction by thermally treating the mixed solution at 100–500° C.; preparing a suspension by dispersing the ultrafine ceramic oxide powder in an organic dispersant; preparing a ceramic sol solution by dissolving constituent ceramic elements of the same or similar constituent as the ultrafine ceramic oxide powder in water or an organic solvent; dispersing by mixing with the ceramic sol solution the suspension in which the ultrafine ceramic oxide powder is dispersed; forming a piezoelectric/electrostrictive film element by submerging a substrate into the suspension in which the ultrafine ceramic oxide powder and the ceramic sol solution are mixed and then performing electrophoretic deposition; and thermally treating the piezoelectric/electrostrictive film element at 100–600° C., so that the solvent is removed by the thermal treatment and bonding among the ultrafine ceramic oxide powder particles is induced, while the ceramic sol acts as a reaction medium on the surfaces of the ceramic oxide particles.

DETAILED DESCRIPTION

The present invention will be explained in detail.

Figure 1:
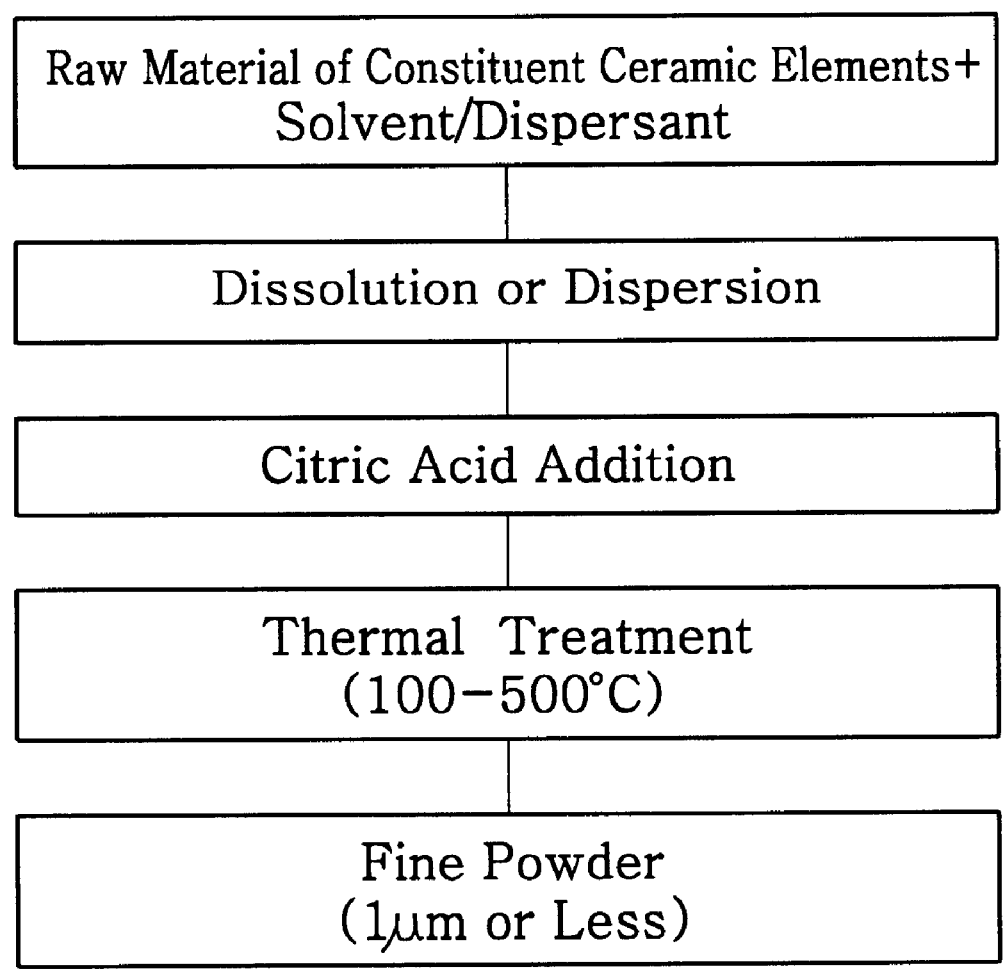
FIG. 1 is a flow diagram for method for producing ultrafine ceramic oxide powder used in the present invention.
Figure 2:
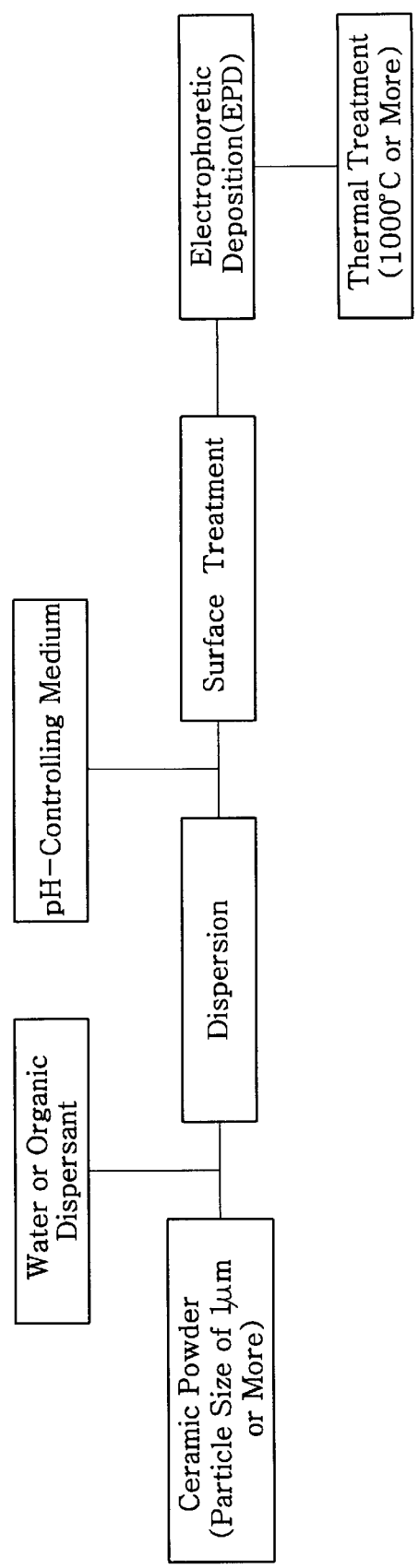
FIG. 2 is a flow diagram of a process for forming a piezoelectric/electrostrictive film element using the conventional electrophoretic deposition.

First, a method for producing an ultrafine ceramic oxide powder used as a raw material in a piezoelectric/electrostrictive film element produced according to the present invention as in the flow diagram of FIG. 1 will be explained.

An ultrafine ceramic oxide powder manufacturing method of the present invention comprises the steps of: sufficiently dissolving or uniformly dispersing the raw material of constituent ceramic elements in a solvent or dispersant to make a solution or a dispersion mixture containing the constituent ceramic elements; adding, into the solution or the dispersion mixture containing the constituent ceramic elements, citric acid in no less than the required amount to give rise to an oxidative-reductive combustion reaction with a anion of the ceramic constituent ceramic element so as to make a mixed solution; and thermally treating the mixed liquid at 100–500° C. But it may additionally further comprises a step of conducting additional thermal treatment at 700–900° C. to increase crystallinity.

As for the raw material containing the constituent ceramic elements, use is made of an oxide, carbonate, nitrate etc. of constituent ceramic element, its salt with organics or inorganics, or a constituent ceramic element complex.

As for the constituent ceramic element, it is preferable to use a piezoelectric/electrostrictive ceramic element comprising lead (Pb) and titanium (Ti) as basic constituent elements.

Especially as to the constituent ceramic element, it is preferable to use that composed of elements including lead (Pb), zirconium (Zr) and titanium (Ti), or lead (Pb), zirconium (Zr), titanium (Ti)/lead (Pb), magnesium (Mg), niobium (Nb).

As for the solvent or the dispersant to dissolve or disperse the raw material of the constituent ceramic elements, one or more are selected from among water and organic solvents that can dissolve or disperse the raw material containing the constituent ceramic elements. As for the organic solvents, mainly acetic acid, dimethyl formamide, methoxyethanol, alcohols, or glycols are used.

As for the combustion aid, citric acid is used, which is an organic compound that can give rise to a combustion reaction. In the conventional method, citric acid has been used, not as a combustion aid, but as a complexing agent in order to give reaction uniformity; and it has been used in processes such as the Pechnini process, where a speed-controlled combustion reaction can be induced using citric acid's flammability and complex formation effect.

A mixture is made by adding citric acid into a solution or a dispersed mixture where constituent ceramic elements are dissolved or dispersed. The quantity of the citric acid added shall not be less than the necessary amount to give rise to an oxidative-reductive combustion reaction with the anion of the constituent ceramic element. Reaction speed can be controlled by the quantity of citric acid added.

The mixture made by the addition of the citric acid is thermally treated at 100–500° C. Though the crystallinity of the ceramic phase increases with the temperature for the thermal treatment, the citric acid combustion reaction may start enough if the temperature for the thermal treatment is over 100° C. Although the reaction can arise even if the temperature for the thermal treatment is above 500° C., thermally treating above that temperature is meaningless when compared with the conventional method.

More preferably, it shall be thermally treated at 150–300° C., which is a temperature range that can secure suitably the crystallinity of the ceramic phase, although it is a considerably low temperature range for a thermal treatment.

If the mixture is thermally treated to vaporize the solvent or the dispersant, the added citric acid acts as a reductive combustion aid and is removed, giving rise to a nonexplosive oxidative-reductive combustion reaction with the anion of a constituent ceramic element, when the ceramic oxide is formed without scattering out by virtue of reaction heat generated at this time.

And in the reaction, components other than the constituent ceramic element are removed after a sufficient time of combustion reaction so that the ultrafine ceramic oxide powder of pure type, without impurity is obtained.

The particle size of the ultrafine ceramic oxide powder obtained by the method is below 1 $\mu$m, and is specifically 0.01–0.1 $\mu$m so extremely fine with uniform powder particle diameter distribution. The primary particles of this powder exist as independent bodies or as a soft aggregate type, and are in completely burnt ceramic phase so that the weight does not decrease even by additional thermal treatment.

Because the powder has excellent surface reactivity, so that molding is feasible even with only a thermal treatment at low temperature, the degree of freedom for a vibration plate is high and diverse methods of printing and coating can be applied.

But it may additionally comprise a step of conducting additional thermal treatment of the obtained ultrafine ceramic oxide powder at 700–900° C. to increase the crystallinity of the powder produced.

Figure 3:
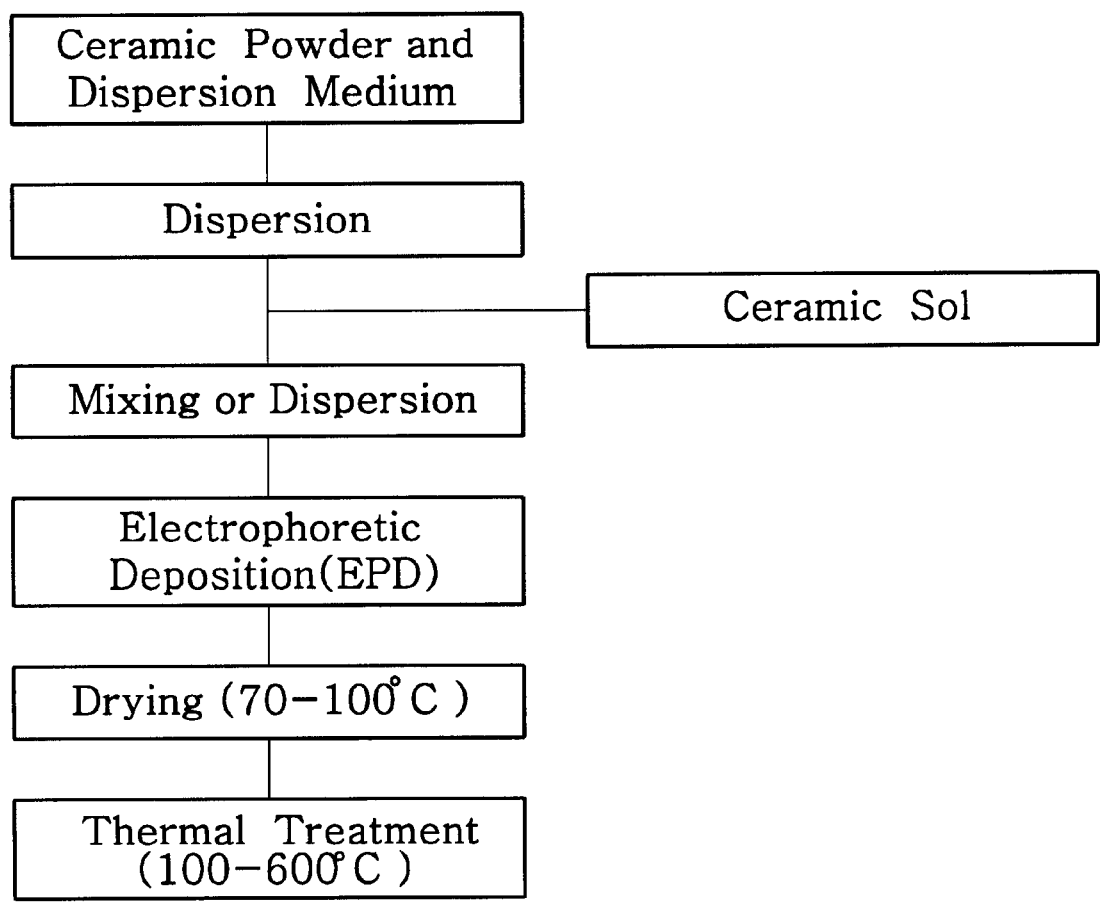
FIG. 3 is a flow diagram of a method for forming a piezoelectric/electrostrictive film element using electrophoretic deposition at low temperature according to the present invention.

A method for forming a piezoelectric/electrostrictive film element at low temperature by an electrophoretic deposition process using ultrafine ceramic oxide powder will be explained. FIG. 3 represents a method for forming a piezoelectric/electrostrictive film element at low temperature by an electrophoretic deposition process.

As for the ceramic oxide powder, the ultrafine ceramic oxide powder obtained by the method is used because it is effective to use fine powder to secure a system feasible of forming at low temperature, considering the powder reactivity itself.

The ultrafine ceramic oxide powder produced has small ceramic particle size with uniform size distribution and no voids, so that it can achieve ideal stacking result with maximum bonding strength between particles.

It is preferable to use PZT, PMN or their solid solution (PZT-PMN) complex oxides for the ultrafine ceramic oxide powder.

The ultrafine ceramic oxide powder may additionally comprise one or more components among nickel (Ni), lanthanum (La), barium (Ba), zinc (Zn), lithium (Li), cobalt (Co), cadmium (Cd), cerium (Ce), chromium (Cr), antimony (Sb), iron (Fe), yttrium (Y), tantalum (Ta), tungsten (W), strontium (Sr), calcium (Ca), bismuth (Bi), tin (Sn) and manganese (Mn).

Because interparticle vacancy exists no matter how closely it approaches an ideal stacking state, in order to improve the density problem occurring according to the interparticle vacancy, there are separately prepared a suspension or a dispersion liquid comprising the ultrafine ceramic oxide powder in an organic dispersant; and a ceramic sol solution having the same or similar composition with the ultrafine ceramic oxide powder.

The ultrafine ceramic oxide powder which is used is dispersed in an organic dispersant, for which are mainly used alcohols such as ethanol and methoxy ethanol, and acetones such as acetone and acetyl acetone.

It is preferable that the content of the organic dispersant is 1–500 ml per gram of the ultrafine ceramic oxide powder. This is used, because adequate dispersion does not arise if the content of the organic dispersant is lower than 1 ml per gram of the ultrafine ceramic oxide powder, while if the content is higher the 500 ml per gram of the ultrafine ceramic oxide powder, the oxide powder is diluted to be of an exceedingly low viscosity.

The ceramic sol solution is made based on water or organic solvent which can be used from among a variety of organic solvents but is preferable to be mainly acetic acid, dimethyl formamide, methoxyethanol, alcohols, glycols.

Then the ceramic sol solution and the suspension of the ultrafine ceramic oxide powder which are prepared separately are mixed. A preferred mixing ratio of the ultrafine ceramic oxide powder and the ceramic sol solution is that the ceramic sol solution is 1–500 parts by weight based on the weight of the ultrafine ceramic oxide powder when the powder and the suspension are mixed.

Thus, if the ultrafine ceramic oxide powder and the ceramic sol solution are mixed, most of the voids occurred after stacking is filled by the ceramic sol and the sol is transferred to the ceramic particles during the thermal treatment process, after the film formation, so that voids substantially decrease.

As the ceramic sol itself has electric charge and is compatible with both the ultrafine ceramic oxide powder and the solvent, it is feasible to achieve stabilization of the suspension and the surface electricity charge treatment of the ultrafine ceramic oxide powder, even without a separate operation and pH control medium.

If a work electrode is attached to the substrate and an opposite electrode dipped into the sol solution make up of the ultrafine ceramic oxide powder and the ceramic sol solution, the ceramic sol and the ultrafine ceramic oxide powder polarized in the sol solution phase move to the work electrode to form a film on the substrate.

Metal, resinous polymeric organic compound, or ceramics may be used as a vibration plate.

For the metal for the vibrating plate, nickel (Ni) or stainless steel is mainly used; as for the resinous polymeric organic compound, polyester, polyimide, or teflon resin is mainly used; and as for the ceramics, alumina ($Al_2O_3$), zirconia ($ZrO_2$), silicon (Si), silicon carbide (SiC), silicon nitride ($Si_3N_4$), silicon dioxide ($SiO_2$), or glasses is mainly used.

At this time, it may be postfinished after generally forming the film on the substrate, or a screen, mold, or mask might be set on the substrate so as to form a piezoelectric/electrostrictive film element of desired type.

It is preferable to form the piezoelectric/electrostrictive film element with a thickness of 1–100 $\mu$m, and more preferable to form it with a thickness of 5–30 $\mu$m.

The form piezoelectric/electrostrictive film is thermally treated to remove the remaining solvent and to convert the contained sol into fine ceramic particles. Thus the solvent is removed by thermal treatment and the ceramic sol acts as a reaction medium on oxide particle surface to induce the bonding between ultrafine ceramic oxide particles.

The reason for the reaction, sufficient only by the thermal treatment at low temperature of 100–600° C., is that a reaction the same as a sintering may take place by mutual reaction of bonding between the ultrafine ceramic oxide powder and the raw material of the constituent ceramic elements in the ceramic sol solution. So, the added organic materials are removed during the thermal treatment.

Specially in case of the polymeric organic compound, because the substrate may be damaged if thermally treated above 500° C., it is preferable to treat it thermally at 100–300° C., when the polymeric organic compound is used as a substrate.

More preferably, thermal treatment may be conducted at 150–300° C., which temperature range can suitably secure the crystallinity and formability of the piezoelectric/electrostrictive film element, although the range is for the thermal treatment at considerably low temperature.

The method mat further comprises a step of drying the formed piezoelectric/electrostrictive film element before the thermal treatment after forming the piezoelectric/electrostrictive film element, and it is preferable to dry the piezoelectric/electrostrictive film element at 70–100° C.

The piezoelectric/electrostrictive film element obtained by the method is excellent in characteristics proper for ceramics, although the element has been thermally treated at low temperature.

For the present invention as above, the energy required for electrophoretic deposition is reduced, because the ultrafine ceramic oxide powder is used and there is a low energization effect of the producing method, because the piezoelectric/electrostrictive film element can be formed when the stacking status of the particles is very dense even with only the thermal treatment at low temperature.

Now the present invention will be explained in detailed by the following practical examples. But the following application examples are only illustrations of the present invention and do not limit the extent of the present invention.

EXAMPLE 1

1 g of fine powder PZT-PMN was added into methoxyethanol 300 ml and acetyl acetone 20 ml, and 1 g of PZT sol was added into the mixed solution. Then, it was dispersed for 30 minutes by an ultrasonic generator. Afterwards it was agitated by a magnetic stirrer.

A SUS 316L plate fixed to the silicon substrate and mask was prepared as a work electrode and a SUS plate of the same area was prepared as an opposite charge electrode. The electrodes were put into the suspension and were connected to an electric supply to produce electrophoretic deposition at 70 V and 0.03 A for 10 minutes.

The work electrode treated by vapor deposition was withdrawn, the substrate was separated from the SUS plate, and the mask was removed.

The substrate portion where a pattern had been formed was thermally treated at 100° C. in a chamber and was dried, and was then thermally treated at 300° C., for 2 hr. Then aluminum was vapor deposited as an upper electrode, and electric potential was applied to measure the displacement of the substrate (vibration plate) by piezoelectric phenomenon.

The piezoelectric characteristics represented by the displacement of the vibration plate were excellent and better than those of a piezoelectric/electrostrictive film element produced by the conventional method.

EXAMPLE 2

1 g of fine powder PZT-PMN was added into methoxyethanol 300 ml and acetyl acetone 100 ml, into which mixed solution, 4 g of PZT sol was added. Then it was dispersed for 30 minutes by a ultrasonic generator. Afterwards it was agitated by a magnetic stirrer.

A SUS 316L plate fixed to a nickel substrate and a mask was prepared as a work electrode and a SUS plate of the same area was prepared as an opposite charge electrode. Then the electrodes were put into the suspension and were connected to an electric supply to produce electrophoretic deposition at 70 V and 0.03 A for 10 minutes.

The work electrode treated by vapor deposition was withdrawn, the substrate was separated from the SUS plate, and the mask was removed.

The substrate portion where pattern had been formed was thermally treated at 70° C. in a chamber and was dried, and was then thermally treated at 300° C., for 2 hr. Then gold was vapor deposited as an upper electrode, and electric potential was applied to measure the displacement of the substrate (vibration plate) by piezoelectric phenomenon.

Piezoelectric characteristics represented by the displacement of the vibration plate were excellent and better than those of a piezoelectric/electrostrictive film element produced by the conventional method.

What is claimed is:

1. Method for forming a piezoelectronic/electrostrictive film element at low temperature using electrophoretic deposition, the method comprising of the steps of:
   a) preparing a solution or a dispersed mixture containing constituent ceramic elements by dissolving or dispersing the raw material of constituent ceramic elements in a solvent or a dispersion medium;
   b) preparing a mixed solution by adding citric acid into said solution or said dispersed mixture in which said constituent ceramic elements are dissolved or dispersed;
   c) getting ultrafine ceramic oxide powder of particular size less than 1 µm with uniform particle diameter size distribution by forming ceramic oxide without scattering over, by a nonexplosive oxidative-reductive combustion reaction by thermally treating said mixed solution at 100–500° C.;
   d) preparing a suspension by dispersing said ultrafine ceramic oxide powder in an organic dispersant;
   e) preparing ceramic sol solution by dissolving constituent ceramic elements of the same or similar constituent with said ultrafine ceramic oxide powder in water or an organic solvent;
   f) dispersing by mixing said suspension in which said ultrafine ceramic oxide powder is dispersed with said ceramic sol solution;
   g) forming a piezoelectric/electrostrictive film element by submerging a substrate into said suspension which said ultrafine ceramic oxide powder and said ceramic sol solution are mixed and then by performing electrophoretic deposition; and
   h) thermally treating said piezoelectric/electrostrictive film element at 100–600° C.,
      so that said solvent is removed by said thermal treatment and
      bonding among said ultrafine ceramic oxide powder particles is induced while said ceramic sol acts as a reaction medium on the surfaces of said ceramic oxide particles.

2. The method in claim 1, further comprising the step of: thermally treating said ultrafine ceramic oxide powder at 700–900° C. before D).

3. The method of claim 2, further comprising the step of: drying said piezoelectric/electrostrictive film between G) and H).

4. The method in claim 3, wherein said piezoelectric/electrostrictive film is dried at 70–100° C.

5. The method in claim 2, wherein the particle size of said ultrafine ceramic oxide powder is 0.01–0.1 µm.

6. The method in claim 1, wherein said substrate is made of metal, resinous polymeric organic compound, or ceramic.

7. The method in claim 6, wherein said metal is nickel (Ni) or stainless steel.

8. The method in claim 6, wherein said resinous polymeric organic compound is polyester, polyimide, or teflon-based resin.

9. The method in claim 6, wherein said ceramic is alumina ($Al_2O_3$), zirconia ($ZrO_2$), silicon (Si), silicon carbide (SiC), silicon nitride ($Si_3N_4$), silicon dioxide ($SiO_2$), or glasses.

10. The method in claim 1, wherein said ultrafine ceramic oxide includes lead (Pb), zirconium (Zr) and titanium (Ti).

11. The method in claim 10, wherein said ultrafine ceramic oxide is PZT, PMN or their solid solution (PZT-PMN) complex oxide.

12. The method in claim 11, wherein said ceramic oxide powder further includes one or more element among nickel (Ni), lanthanum (La), barium (Ba), zinc (Zn), lithium (Li), cobalt (Co), cadmium (Cd), cerium (Ce), chromium (Cr), antimony (Sb), iron (Fe), yttrium (Y), tantalum (Ta), tungsten (W), strontium (Sr), calcium (Ca), bismuth (Bi), tin (Sn) and manganese (Mn).

13. The method in claim 1, wherein said organic dispersion medium in which said ultrafine ceramic oxide powder is dispersed is an alcohol or an acetone.

14. The method in claim 1, wherein the content of said organic dispersant is 1–500 ml per gram of the ultrafine ceramic oxide powder which is dispersed.

15. The method in claim 1, wherein said organic solvent which is a base of said ceramic sol solution is acetic acid, dimethyl formamide, methoxyethanol, an alcohol, or a glycol.

16. The method in claim 1, wherein the content of said ceramic sol solution is 1–500 parts by weight based on the weight of said ceramic oxide powder when said suspension of said ultrafine ceramic oxide powder and said ceramic sol solution are mixed.

17. The method in claim 1, wherein the thickness of said piezoelectric/electrostrictive film element is 1–100 $\mu$m.

18. The method in claim 17, wherein the thickness of said piezoelectric/electrostrictive film element is 5–30 $\mu$m.

19. The method in claim 1, wherein said piezoelectric/electrostrictive film element is thermally treated at 150–300° C.

20. The method of claim 1, further comprising the step of:
    drying said piezoelectric/electrostrictive film between G) and H).

21. The method in claim 20, wherein said piezoelectric/electrostrictive film is dried at 70–100° C.

22. The method in claim 1, wherein the particle size of said ultrafine ceramic oxide powder is 0.01–0.1 $\mu$m.

* * * * *